(12) United States Patent
Lin et al.

(10) Patent No.: US 12,021,091 B2
(45) Date of Patent: Jun. 25, 2024

(54) METHOD OF MANUFACTURING AN ARRAY SUBSTRATE WHEREIN STATIC ELECTRICITY IS DISCHARGED FROM AN OXIDE SEMICONDUCTOR FILM

(71) Applicants: Fuzhou BOE Optoelectronics Technology Co., Ltd., Fujian (CN); BOE TECHNOLOGY GROUP CO., LTD., Beijing (CN)

(72) Inventors: Bin Lin, Beijing (CN); Yong Zeng, Beijing (CN); Yazhou Huo, Beijing (CN); Liangliang Li, Beijing (CN); Zhouyu Chen, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 470 days.

(21) Appl. No.: 17/298,493

(22) PCT Filed: Sep. 25, 2020

(86) PCT No.: PCT/CN2020/117632
§ 371 (c)(1),
(2) Date: May 28, 2021

(87) PCT Pub. No.: WO2021/057883
PCT Pub. Date: Apr. 1, 2021

(65) Prior Publication Data
US 2022/0028901 A1   Jan. 27, 2022
US 2022/0278134 A2   Sep. 1, 2022

(30) Foreign Application Priority Data

Sep. 25, 2019  (CN) .......................... 201910913692.1

(51) Int. Cl.
*H01L 27/12* (2006.01)
*H01L 27/02* (2006.01)
(Continued)

(52) U.S. Cl.
CPC ........ *H01L 27/127* (2013.01); *H01L 27/0288* (2013.01); *H01L 27/124* (2013.01);
(Continued)

(58) Field of Classification Search
CPC ............. H01L 27/0251; H01L 27/1225; H01L 27/124; H01L 27/127; H10K 59/1201; H10K 59/1315
See application file for complete search history.

(56) References Cited

U.S. PATENT DOCUMENTS 9,812,436 B2    11/2017  Su et al.
2016/0013415 A1*  1/2016  Ren ...................... H10K 71/621
                                                              257/40
(Continued)

FOREIGN PATENT DOCUMENTS

CN    104392990 A    3/2015
CN    104766868 A    7/2015
(Continued)

OTHER PUBLICATIONS

First Office Action dated Apr. 23, 2021 by the China National Intellectual Property Administration for China patent application No. 201910913692.1.

*Primary Examiner* — Herve-Louis Y Assouman
*Assistant Examiner* — Christopher M Roland
(74) *Attorney, Agent, or Firm* — IP & T GROUP LLP

(57) ABSTRACT

The present disclosure provides an array substrate and a preparation method thereof, belonging to the field of display technology. The preparation method of the array substrate includes: providing a base substrate; forming a common
(Continued)

electrode bonding line on one side of the base substrate; forming an oxide semiconductor material layer, and the oxide semiconductor material layer and the common electrode bonding line are located on the base substrate on the same side, and the oxide semiconductor material layer is electrically connected to at least part of the common electrode bonding line; the oxide semiconductor material layer is patterned to form an oxide semiconductor layer with multiple active layers, and the oxide semiconductor layer is The orthographic projection on the base substrate and the common electrode bonding line overlap at most parts of the orthographic projection on the base substrate, and any active layer and the common electrode bonding line are insulated from each other. The preparation method of the array substrate can avoid electrostatic breakdown of the array substrate during the preparation process.

8 Claims, 10 Drawing Sheets

(51) Int. Cl.
   *H10K 59/12*   (2023.01)
   *H10K 59/131*  (2023.01)
   *G02F 1/1362*  (2006.01)

(52) U.S. Cl.
   CPC ... *H10K 59/1201* (2023.02); *G02F 1/136204* (2013.01); *H01L 27/1225* (2013.01); *H10K 59/1315* (2023.02)

(56) References Cited

U.S. PATENT DOCUMENTS

| | | | |
|---|---|---|---|
| 2016/0043229 A1* | 2/2016 | Woo | H01L 29/24 257/43 |
| 2017/0176826 A1* | 6/2017 | Tsuda | G02F 1/1368 |
| 2020/0401005 A1 | 12/2020 | Zhang et al. | |
| 2021/0217778 A1 | 7/2021 | Xie et al. | |

FOREIGN PATENT DOCUMENTS

| | | |
|---|---|---|
| CN | 106684070 A | 5/2017 |
| CN | 106847826 A | 6/2017 |
| CN | 107589606 A | 1/2018 |
| CN | 108987445 A | 12/2018 |
| CN | 109952532 A | 6/2019 |
| CN | 110518023 A | 11/2019 |
| JP | 2012238863 A | 12/2012 |
| JP | 2016157263 A | 9/2016 |

\* cited by examiner

METHOD OF MANUFACTURING AN ARRAY SUBSTRATE WHEREIN STATIC ELECTRICITY IS DISCHARGED FROM AN OXIDE SEMICONDUCTOR FILM

CROSS-REFERENCE TO RELATED APPLICATIONS

This application is a national phase entry under 35 USC 371 of International Patent Application No. PCT/CN 2020/117632, filed on Sep. 25, 2020, which claims priority to Chinese Patent Application No. 201910913692.1, filed on Sep. 25, 2019, which are incorporated herein by reference in their entirety.

TECHNICAL FIELD

The present disclosure relates to the field of display technologies, and in particular, to an array substrate and a method of manufacturing the same, and a display apparatus.

BACKGROUND

An oxide semiconductor material is used as active layers in oxide thin film transistors, which has good uniformity, and is especially suitable for large-area displays.

SUMMARY

In an aspect, a method of manufacturing an array substrate is provided. The method of manufacturing the array substrate includes: providing a base; forming a plurality of conductive lines on a side of the base; forming an oxide semiconductor film on a side of the plurality of conductive lines away from the base, the oxide semiconductor film covering the plurality of conductive lines and being in direct contact with at least one conductive line, and the at least one conductive line being configured to discharge static electricity generated in the oxide semiconductor film; and patterning the oxide semiconductor film by using a photoetching process to remove a portion of the oxide semiconductor film that is in direct contact with the at least one conductive line, and form an oxide semiconductor layer including active layers of a plurality of oxide thin film transistors, the oxide semiconductor layer and the at least one conductive line being insulated from each other.

In some embodiments, the method of manufacturing the array substrate further includes: before forming the oxide semiconductor film, forming a gate conductive layer including gates of the plurality of oxide thin film transistors, the gate conductive layer and the plurality of conductive lines being located on the same side of the base; forming a gate insulating film on a side of both the plurality of conductive lines and the gate conductive layer away from the base, the gate insulating film covering the plurality of conductive lines and the gate conductive layer; and patterning the gate insulating film to form a gate insulating layer with at least one via hole, an orthogonal projection of the at least one via hole on the base being at least partially overlapped with an orthogonal projection of the at least one conductive line on the base. The oxide semiconductor film is in direct contact with the at least one conductive line through the at least one via hole.

In some embodiments, a portion of a boundary of the orthogonal projection of the at least one conductive line on the base coincides with a portion of a boundary of the orthogonal projection of the at least one via hole on the base.

In some embodiments, a material of the plurality of conductive lines includes a metal material. The plurality of conductive lines and the gate conductive layer are formed in a same patterning process.

In some embodiments, the method of manufacturing the array substrate further includes: forming a source-drain conductive layer on a side of the oxide semiconductor layer away from the base. The source-drain conductive layer includes sources and drains of the plurality of oxide thin film transistors that are in direct contact with respective active layers.

In some embodiments, the array substrate has a display area and a bezel area located beside the display area. The source-drain conductive layer further includes at least one auxiliary lead that is in direct contact with the at least one conductive line. The at least one auxiliary lead and the at least one conductive line are located in the bezel area. The at least one conductive line is configured to transmit a common voltage signal to the display area, or to perform an electrostatic protection on the array substrate. The at least one auxiliary lead is configured to be connected in parallel with the at least one conductive line, so as to reduce a resistance of the at least one conductive line.

In some embodiments, a material of the oxide semiconductor film includes one of zinc oxide, indium oxide, stannic oxide, indium zinc oxide, zinc tin oxide, aluminum zinc oxide, yttrium zinc oxide, indium tin zinc oxide, indium gallium zinc oxide, and indium aluminum zinc oxide.

In some embodiments, an orthogonal projection of the oxide semiconductor layer on the base is at most partially overlapped with an orthogonal projection of the at least one conductive line on the base.

In another aspect, an array substrate is provided. The array substrate includes: a base; a plurality of conductive lines disposed on a side of the base; and a plurality of oxide thin film transistors. The plurality of oxide thin film transistors and the plurality of conductive lines are disposed on the same side of the base. Each oxide thin film transistor includes a gate, an active layer, a source, and a drain. Active layers of the plurality of oxide thin film transistors are obtained by patterning an oxide semiconductor film that is in direct contact with at least one of the plurality of conductive lines, and the active layers and the at least one conductive line are insulated from each other.

In some embodiments, the array substrate further includes a gate insulating layer disposed between gates and active layers of the plurality of oxide thin film transistors. The gate insulating layer has at least one via hole. An orthogonal projection of the at least one via hole on the base is at least partially overlapped with an orthogonal projection of the at least one conductive line on the base. The oxide semiconductor film is in direct contact with the at least one conductive line through the at least one via hole.

In some embodiments, the array substrate further includes at least one auxiliary lead disposed on a side of the gate insulating layer away from the base. The at least one auxiliary lead is in direct contact with the at least one conductive line through the at least one via hole.

In some embodiments, the array substrate further includes at least one auxiliary lead made of a same material and arranged in a same layer as the source and the drain. The at least one auxiliary lead is in direct contact with the at least one conductive line.

In some embodiments, an orthogonal projection of the at least one auxiliary lead on the base is at least partially overlapped with the orthogonal projection of the at least one conductive line on the base.

In some embodiments, a routing direction of the at least one auxiliary lead is same as a routing direction of the at least one conductive line.

In some embodiments, the array substrate further includes a passivation layer disposed on a side of both sources and drains of the plurality of oxide thin film transistors away from the base. A portion of the passivation layer is located in the at least one via hole, and is in direct contact with the at least one conductive line.

In some embodiments, the array substrate has a display area and a bezel area located beside the display area. The at least one conductive line is located in the bezel area. The at least one conductive line includes a common electrode line or an electrostatic protection line. The common electrode line is configured to transmit a common voltage signal to the display area. The electrostatic protection line is configured to perform an electrostatic protection on the array substrate.

In some embodiments, the gate and the plurality of conductive lines are made of a same material and arranged in a same layer.

In yet another aspect, a display apparatus is provided. The display apparatus includes the array substrate as described in any of the above embodiments.

In some embodiments, the display apparatus further includes an opposite substrate arranged opposite to the array substrate, and a liquid crystal layer disposed between the array substrate and the opposite substrate.

In some embodiments, the display apparatus further includes a plurality of light-emitting devices disposed on a side of the plurality of oxide thin film transistors in the array substrate away from the base in the array substrate.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art may obtain other drawings according to those drawings. In addition, the accompanying drawings in the following description may be regarded as schematic diagrams, and are not limitations on an actual size of a product, an actual process of a method, and an actual timing of a signal involved in the embodiments of the present disclosure.

DETAILED DESCRIPTION

Figure 1:
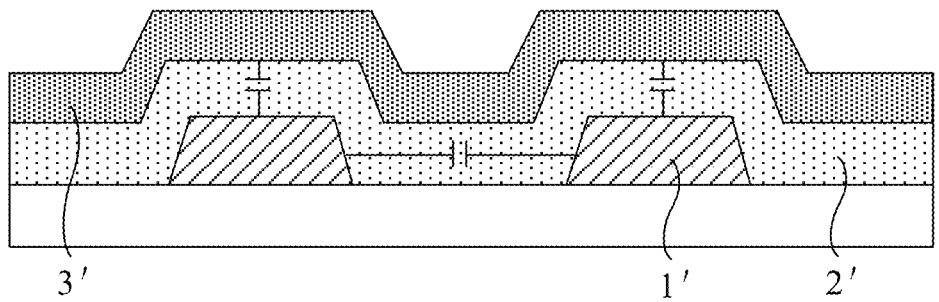
FIG. 1 is a structural diagram showing an electrostatic accumulation in an oxide semiconductor film, in accordance with the related art.

The technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment," "some embodiments," "exemplary embodiments," "an example," "specific example" or "some examples" are intended to indicate that specific features, structures, materials or characteristics related to the to embodiment(s) or example(s) are included in at least one embodiment or example of the present disclosure. Schematic representations of the above terms do not necessarily refer to the same embodiment(s) or example (s). In addition, the specific features, structures, materials, or characteristics may be included in any one or more embodiments or examples in any suitable manner.

Below, the terms such as "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, "a/the plurality of" means two or more unless otherwise specified.

In the description of some embodiments, the term "connected" and derivatives thereof may be used. For example, the term "connected" may be used in the description of some embodiments to indicate that two or more components are in direct physical or electric contact with each other. The embodiments disclosed herein are not necessarily limited to the contents herein.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is determined" or "in response to detecting [the stated condition or event]", depending on the context.

The use of "applicable to" or "configured to" herein is means an open and inclusive expression, which does not exclude devices applicable to or configured to perform additional tasks or steps.

Additionally, the use of "based on" is meant to be open and inclusive, in that a process, step, calculation, or other actions "based on" one or more recited conditions or values may, in practice, be based on additional conditions or values beyond those recited.

As used herein, "about" or "approximately" is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to sectional views and/or plan views as idealized exemplary drawings. In the drawings, thicknesses of layers and regions are exaggerated for clarity. Therefore, variations in shapes with respect to the drawings due to, for example, manufacturing techniques and/or tolerances are conceivable. Therefore, the exemplary embodiments should not be construed as being limited to the shapes of the regions shown herein, but include the deviations in shapes due to, for example, manufacturing. For example, an etched region that is shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

An active layer of an oxide thin film transistor may be, for example, manufactured by using a photoetching process.

That is, in a process of forming the active layer of the oxide thin film transistor, a layer of an oxide semiconductor material film may be deposited first, and then a photoresist layer may be formed on a surface of the oxide semiconductor material film. The photoresist layer is exposed and developed to obtain a patterned photoresist layer, and the patterned photoresist layer may be used to pattern the oxide semiconductor material film, so as to obtain the active layer.

However, the oxide semiconductor material film is easy to generate and accumulate static electricity in an exposure machine, and thus an electrostatic breakdown (i.e., electrostatic discharge (ESD)) may occur, which reduces a yield of an array substrate including the oxide thin film transistor.

In an implementation manner, in an example where the oxide thin film transistor is a bottom-gate thin film transistor, as shown in FIG. 1, in a process of manufacturing the oxide thin film transistors, for example, a plurality of gates 1' may be formed first, and then a gate insulating layer 2' covering the plurality of gates 1' and an oxide semiconductor material film 3' covering the gate insulating layer 2' are sequentially formed on a side of the plurality of gates 1'. Then, the oxide semiconductor material film 3' is patterned by using the photoetching process.

Since an oxide semiconductor material is usually a substance with an amorphous structure, and is poor in conductivity, in a process of exposing the photoresist layer in the exposure machine, the static electricity is easily generated in the oxide semiconductor material film 3'. In addition, the oxide semiconductor material film 3' may also form parasitic capacitance structures with other conductive structures. For example, the oxide semiconductor material film 3' may form parasitic capacitance structures with the gates 1', and induce different gates 1' to form parasitic capacitance structures. In a case where a large amount of static electricity generated in the oxide semiconductor material film 3' accumulates, the electrostatic breakdown is easy to occur.

Figure 2:
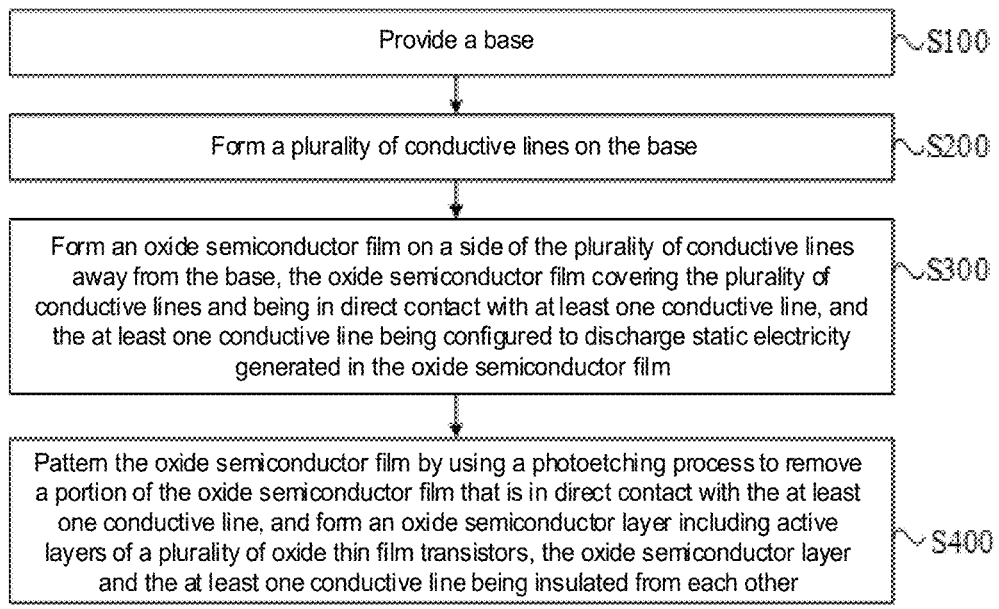
FIG. 2 is a flow diagram of a method of manufacturing an array substrate, in accordance with some embodiments of the present disclosure.
Figure 3:
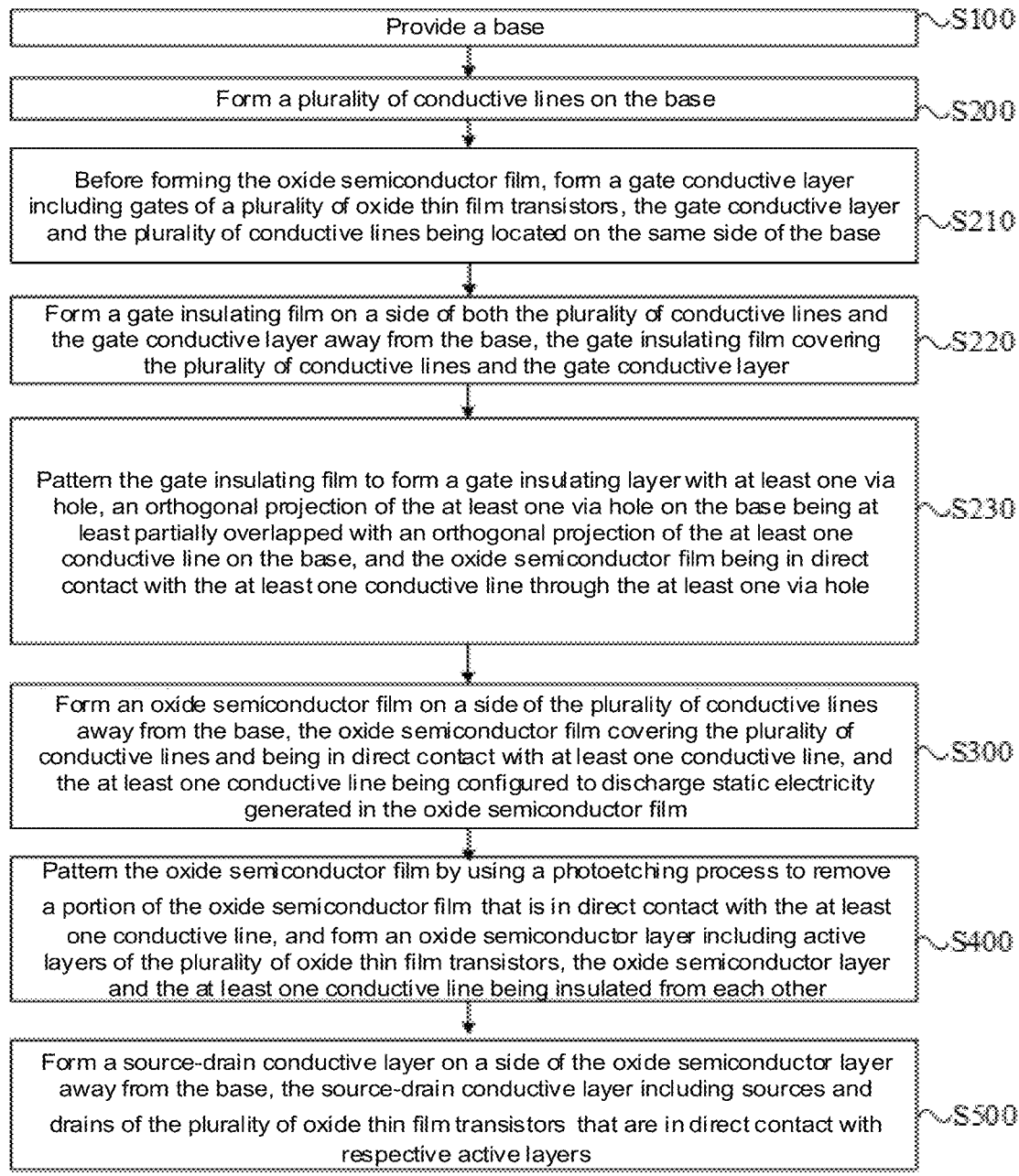
FIG. 3 is a flow diagram of a method of manufacturing another array substrate, in accordance with some embodiments of the present disclosure.

Based on this, some embodiments of the present disclosure provide a method of manufacturing an array substrate. As shown in FIG. 2, the method of manufacturing the array substrate includes S100 to S400.

In S100, a base 1 is provided.

A category of the base 1 is various, which may be selectively set according to actual needs.

In some examples, the base 1 may be an inorganic material base, or may be an organic material base.

For example, in an implementation manner of the present disclosure, the material of the base 1 may be soda-lime glass, quartz glass, sapphire glass, etc., or may be stainless steel, aluminum, nickel, etc. In another implementation manner of the present disclosure, the material of the base 1 may be polymethyl methacrylate (PMMA), polyvinyl alcohol (PVA), polyvinyl phenol (PVP), polyether sulfone (PES), polyimide (PI), polyamide, polyacetal, polycarbonate (PC), polyethylene terephthalate (PET), polyethylene naphthalate (PEN), or a combination of at least two of the foregoing.

Here, in a case of using the inorganic material for the base 1, the base 1 may be a rigid base. In a case of using the organic material for the base 1, the base 1 may be a flexible base.

Figure 4A:
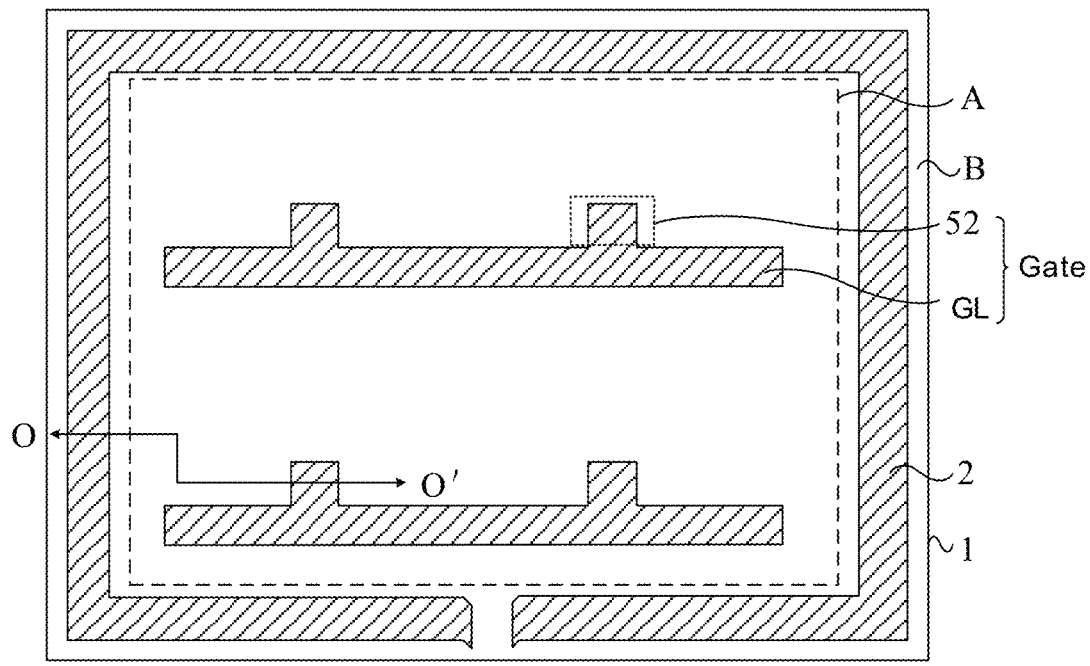
FIGS. 4a to 4g are schematic diagrams showing a manufacturing process of an array substrate, in accordance with some embodiments of the present disclosure.
Figure 5A:
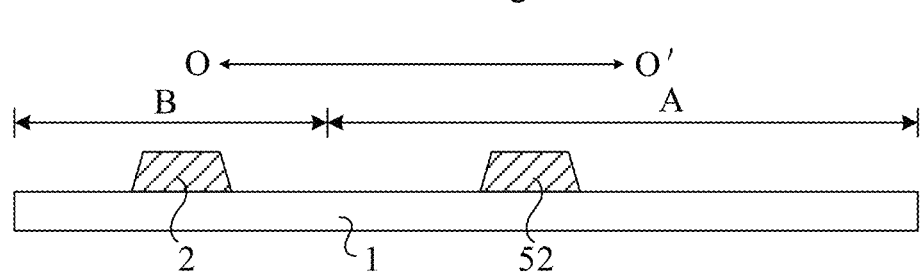
FIGS. 5a to 5I are schematic diagrams showing a manufacturing process taken along the O-O' direction in the manufacturing process shown in FIGS. 4a to 4g.

In S200, as shown in FIGS. 4a and 5a, a plurality of conductive lines 2 are formed on the base 1.

In some examples, a material of the conductive lines 2 may include a conductive material or a combination of a plurality of conductive materials.

For example, the material of the conductive lines 2 may include a metal material, a conductive metal oxide material, a conductive metal nitride material, a conductive polymer material, a conductive composite material, or a combination of at least two of the foregoing.

The metal material may be, for example, platinum, gold, silver, aluminum, chromium, nickel, copper, molybdenum, titanium, magnesium, calcium, barium, sodium, palladium, iron, manganese, or a combination of at least two of the foregoing.

The conductive metal oxide material may be, for example, indium tin oxide (ITO), fluorine-doped tin oxide (FTO), or doped metal oxide.

The conductive metal nitride material may be, for example, titanium nitride.

The conductive polymer material may be, for example, polyaniline, polypyrrole, polythiophene, polyacetylene, poly(3,4-ethylenedioxythiophene)/poly(sodium-p-styrene-sulfonate) (PEDOT/PSS) or a combination of at least two of the foregoing, or the above material doped with a dopant. The dopant may be an acid such as hydrochloric acid, sulfuric acid, or sulfonic acid, or a Lewis acid such as $PF_6$, $AsF_5$, or $FeCl_3$, or a halogen ion such as iodide ion, or a metal ion such as sodium ion or potassium ion.

The conductive composite material may be, for example, a conductive composite material dispersed with carbon black, graphite powders, or metal particles.

In some examples, the conductive line 2 may be of a single-layer structure composed of a layer of conductive material, or may be of a multi-layer structure formed to by sequentially stacking a plurality of layers of conductive materials.

For example, the conductive line 2 may be of a single-layer structure formed by a layer of metal material.

For another example, the conductive line 2 may be of a three-layer structure formed by a first metal layer, a second metal layer, and the first metal layer that are sequentially stacked. The first metal layer may be a single-layer structure formed by at least one metal material, the second metal layer may be a single-layer structure formed by at least one metal material, and the metal material(s) included in the first metal layer are different from the metal material(s) included in the second metal layer.

Figure 4B:
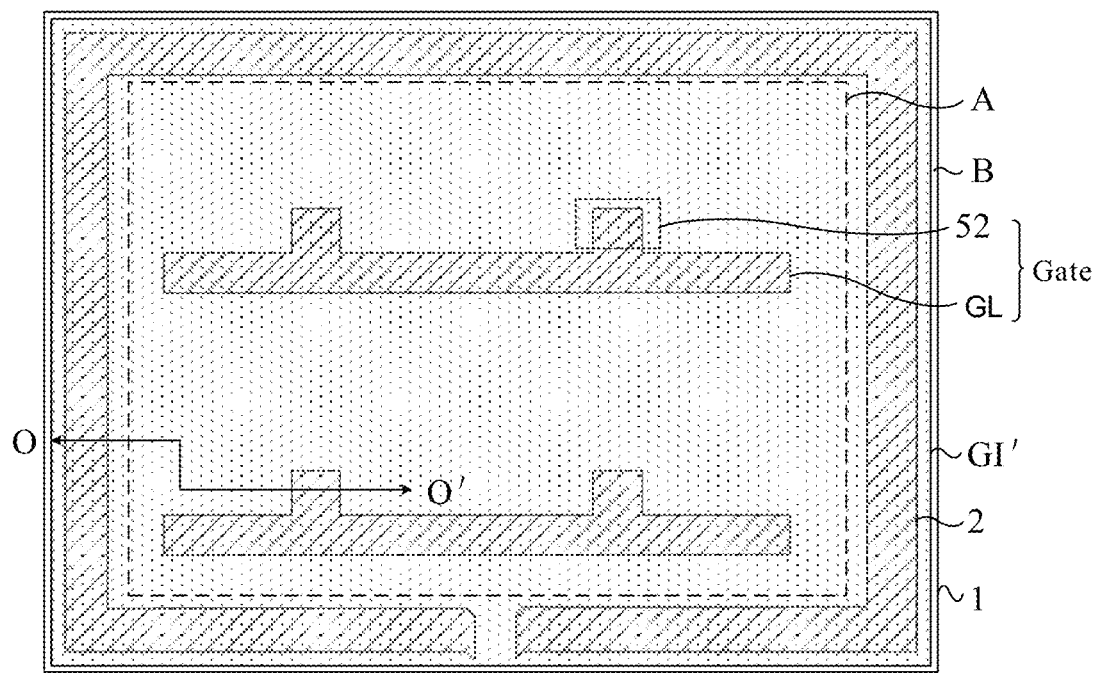
Figure 4C:
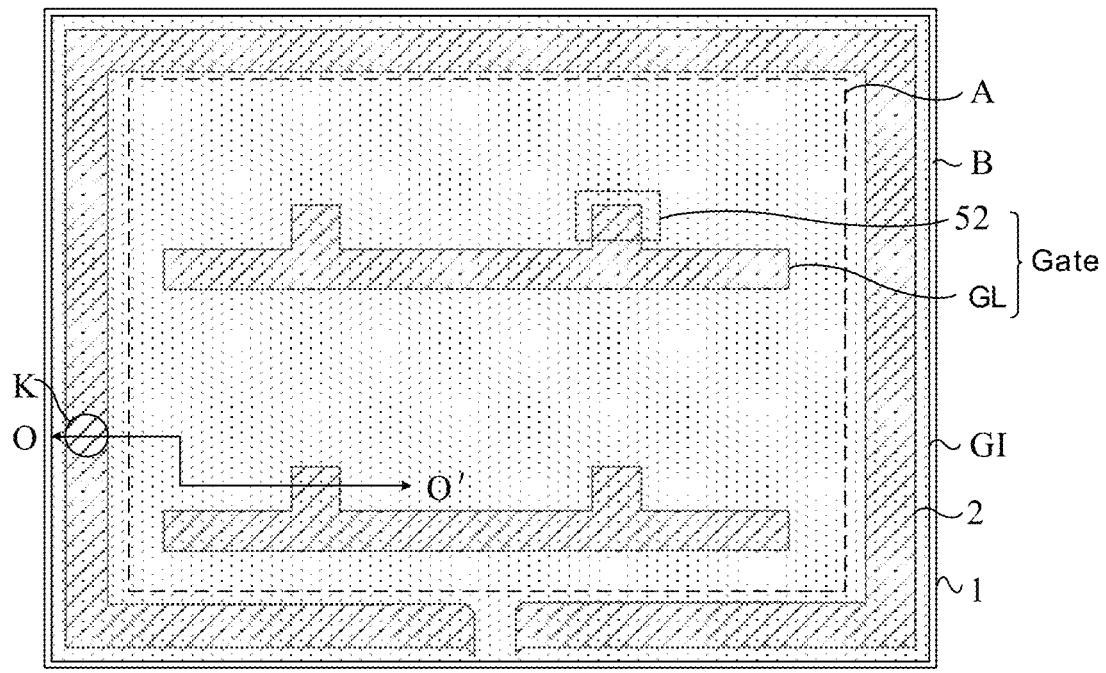
Figure 4D:
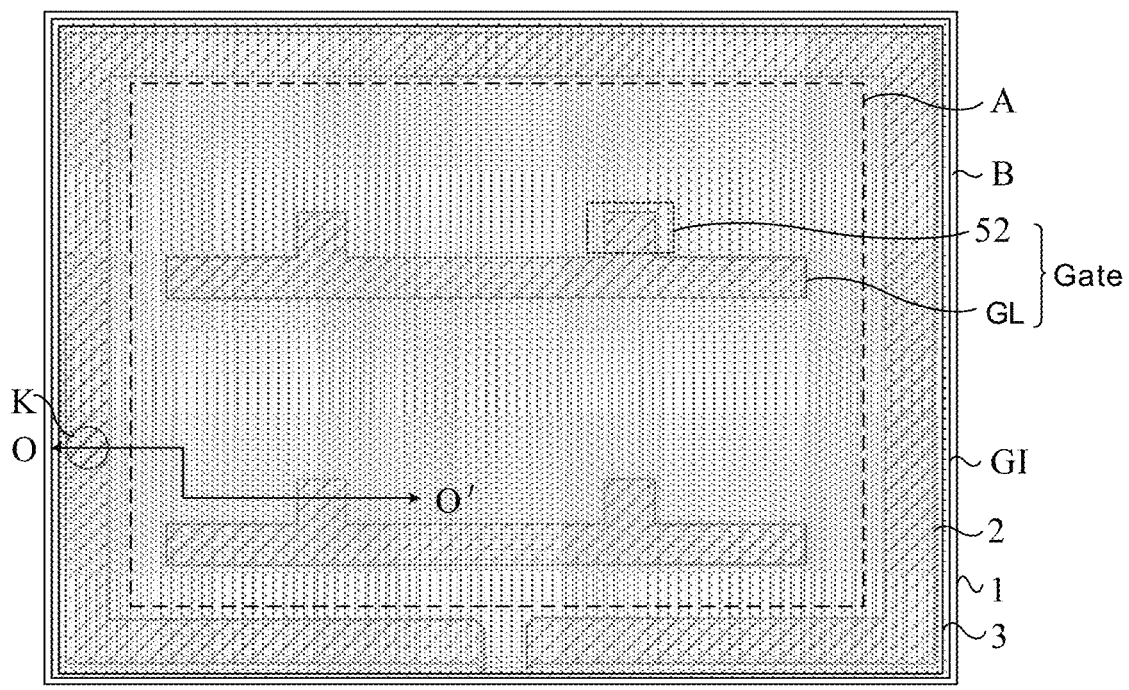
Figure 5B:
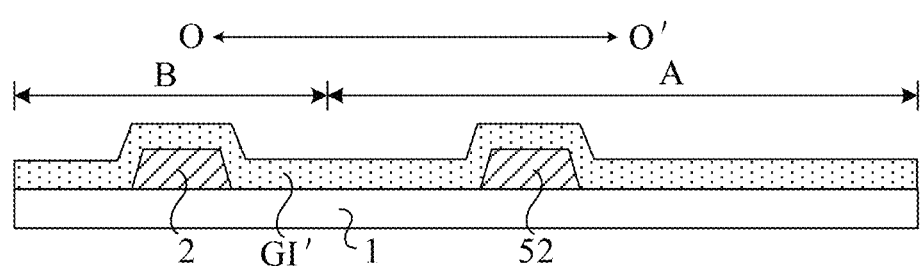
Figure 5C:
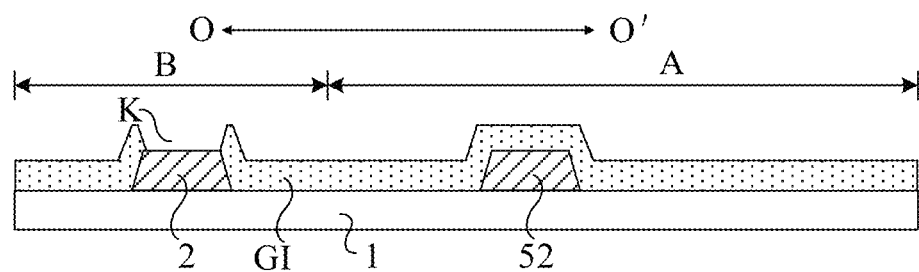
Figure 5D:
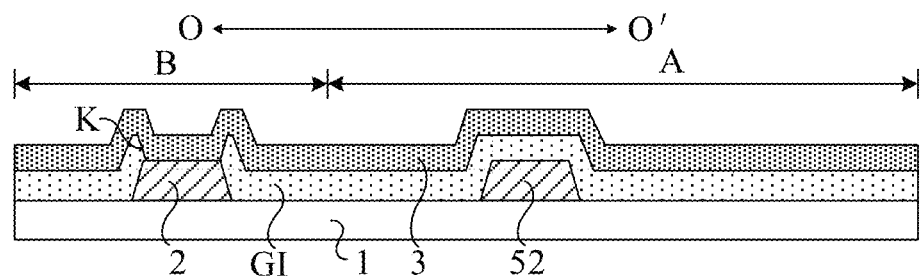

In S300, as shown in FIGS. 4d and 5d, an oxide semiconductor film 3 is formed on a side of the plurality of conductive lines 2 away from the base 1. The oxide semiconductor film 3 covers the plurality of conductive lines 2, and is in direct contact with at least one conductive line 2. That is, the oxide semiconductor film 3 may be in direct contact with one conductive line 2, or may be in direct contact with a plurality of conductive lines 2. The at least one conductive line 2 is configured to discharge static electricity generated in the oxide semiconductor film 3.

In some examples, a magnetron sputtering process may be used to manufacture the oxide semiconductor film 3.

In some examples, the oxide semiconductor film 3 may be made of an amorphous oxide semiconductor material.

For example, the oxide semiconductor material may be one of zinc oxide (ZnO), indium oxide (InO), stannic oxide ($SnO_2$), indium zinc oxide (IZO), zinc tin oxide (ZTO), aluminum zinc oxide (AZO), yttrium zinc oxide (YZO), indium tin zinc oxide (ITZO), indium gallium zinc oxide (IGZO), or indium aluminum zinc oxide (IAZO). Optionally, the oxide semiconductor material may be in an amorphous state. That is, the oxide semiconductor material may be the amorphous oxide semiconductor material.

For example, the oxide semiconductor film 3 may be an amorphous indium gallium zinc oxide film.

Figure 4E:
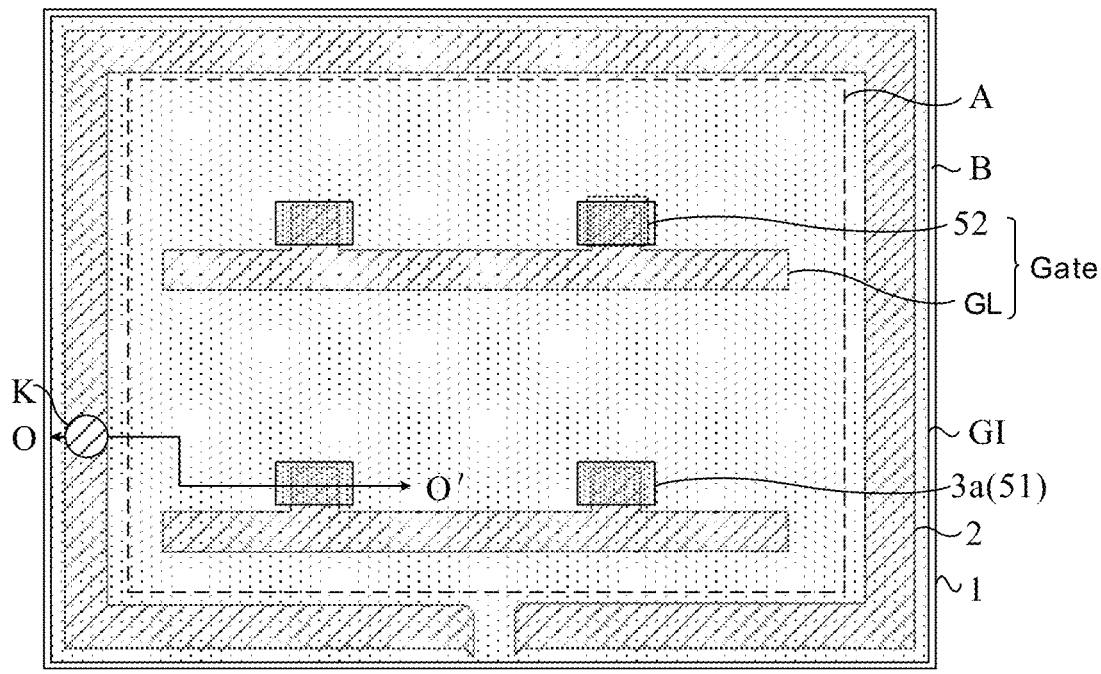
Figure 5E:
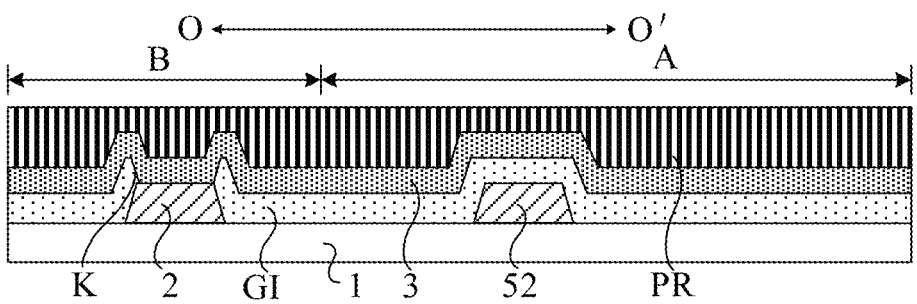
Figure 5F:
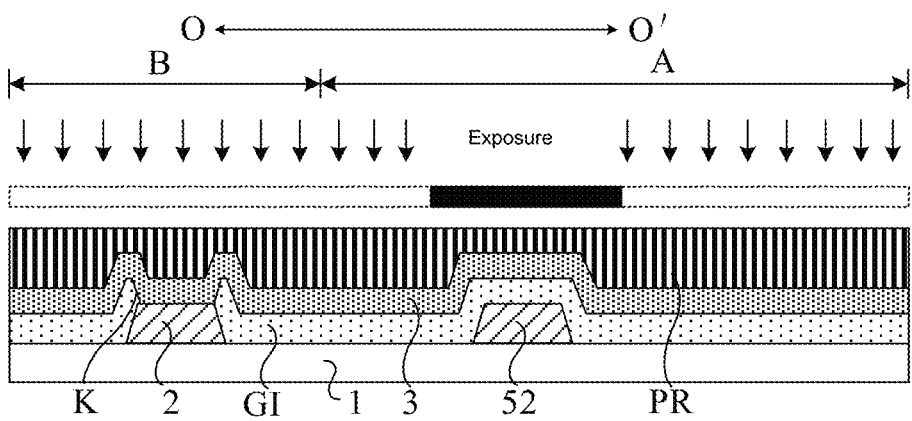
Figure 5G:
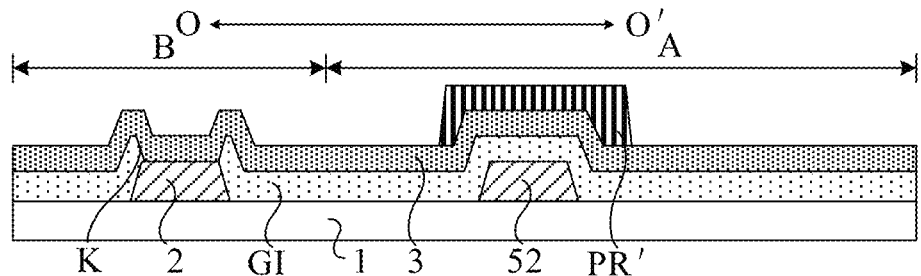
Figure 5H:
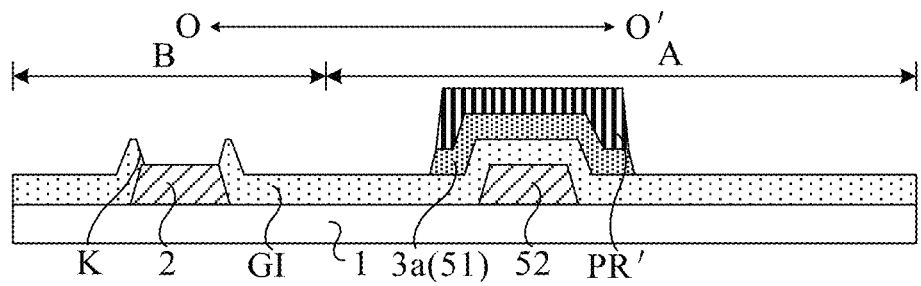
Figure 5I:
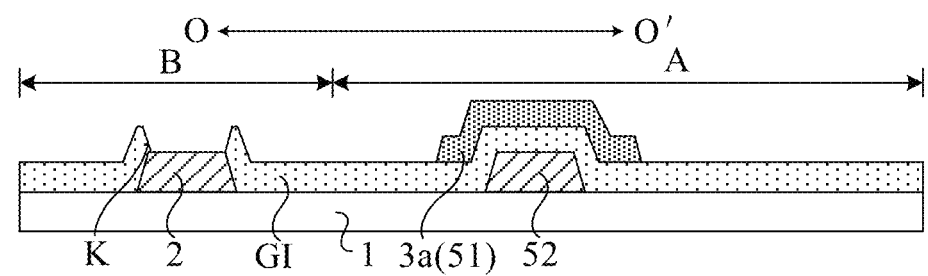

In S400, as shown in FIGS. 4e and 5i, the oxide semiconductor film 3 is patterned to remove a portion of the oxide semiconductor film 3 that is in direct contact with the at least one conductive line 2, and form an oxide semiconductor layer 3a including active layers 51 of a plurality of oxide thin film transistors 5. The oxide semiconductor layer 3a and the at least one conductive line 2 are insulated from each other.

In some examples, in S400 described above, a photoetching process may be used to pattern the oxide semiconductor film 3.

For example, as shown in FIGS. 5e to 5i, patterning the oxide semiconductor film 3 by using the photoetching process, includes S410 to S450.

In S410, as shown in FIG. 5e, a photoresist layer PR is formed on a surface of the oxide semiconductor film 3 away from the base 1.

For example, a coating process may be used to coat a photoresist on the surface of the oxide semiconductor film 3 away from the base 1, so as to form the photoresist layer PR.

A type of the photoresist is various. For example, the photoresist may be a positive photoresist. Or the photoresist may be a negative photoresist.

The method of manufacturing the array substrate will be schematically described below in an example where the photoresist is the positive photoresist.

In S420, as shown in FIG. 5f, the photoresist layer PR is exposed.

For example, the photoresist layer PR may be exposed in an exposure machine.

For example, in a process of exposing the photoresist layer PR, the static electricity is generated in the oxide semiconductor film 3. In a case where the oxide semiconductor film 3 is electrically connected to the at least one conductive line 2, the static electricity generated in the oxide semiconductor film 3 may be discharged into the at least one conductive line 2, and the static electricity is discharged through the at least one conductive line 2, which reduces or even avoids the electrostatic accumulation in the oxide semiconductor film 3, thereby avoiding the electrostatic breakdown caused by a large amount of static electricity accumulated in the oxide semiconductor film 3.

In S430, as shown in FIG. 5g, the exposed photoresist layer PR is developed to remove an exposed portion of the photoresist layer PR, so as to obtain a patterned photoresist layer PR'. The patterned photoresist layer PR' exposes a portion of the surface of the oxide semiconductor film 3 away from the base 1, and covers the remaining portion of the oxide semiconductor film 3.

In S440, as shown in FIG. 5h, the oxide semiconductor film 3 is patterned by using the patterned photoresist layer PR' as a mask. A portion of the oxide semiconductor film 3 that is not covered by the patterned photoresist layer PR' is removed by etching, and a portion (i.e., the oxide semiconductor layer 3a) of the oxide semiconductor film 3 that is covered by the patterned photoresist layer PR' is remained.

It can be understood that an orthogonal projection of the oxide semiconductor layer 3a on the base 1 is at most partially overlapped with an orthogonal projection of the at least one conductive line 2 on the base 1, and the oxide semiconductor layer 3a and the at least one conductive line 2 are insulated from each other. In this way, it is possible to ensure an effective electrical connection between the at least one conductive line 2 and a film formed by subsequent manufacturing, which avoids a poor power supply caused by the oxide semiconductor layer 3a sandwiched between the at least one conductive line 2 and the film formed by subsequent manufacturing, and also avoids adding an additional process to remove the portion of the oxide semiconductor film 3 that is in direct contact with the at least one conductive line 2.

In S450, as shown in FIG. 5i, the patterned photoresist layer PR' is removed.

In the method of manufacturing the array substrate provided by some embodiments of the present disclosure, the plurality of conductive lines 2 are formed on the side of the base 1, and after the oxide semiconductor film 3 is formed, the oxide semiconductor film 3 is in direct contact with the at least one conductive line 2. In this way, in the process of patterning the oxide semiconductor film 3, the static electricity generated in the oxide semiconductor film 3 may be discharged into the at least one conductive line 2 with good conductivity, which is beneficial to reducing the electrostatic accumulation in the oxide semiconductor layer 3a including a plurality of active layers 51, avoiding the electrostatic breakdown, and improving a yield of the manufactured array substrate.

It will be noted that a category of the thin film transistor 5 formed in the array substrate is various, which may be selectively set according to actual needs.

In some embodiments, the oxide thin film transistor 5 formed in the array substrate may be a bottom-gate oxide thin film transistor. In some other embodiments, the oxide thin film transistor 5 formed in the array substrate may be a top-gate oxide thin film transistor.

The method of manufacturing the array substrate will be schematically described below in an example where the oxide thin film transistor 5 formed in the array substrate is the bottom-gate oxide thin film transistor. As shown in FIGS. 4a to 4c and 5a to 5c, the method of manufacturing the array substrate may further include S210 to S230.

In S210, as shown in FIGS. 4a and 5a, before S300 described above, a gate conductive layer Gate is formed. The gate conductive layer Gate and the plurality of conductive lines 2 are located on the same side of the base 1.

For example, the gate conductive layer Gate may include a plurality of gate lines GL and gates 52 of the plurality of oxide thin film transistors 5. Each gate 52 may be arranged opposite to the active layer 51 formed by subsequent manufacturing.

In some examples, a material and a layer structure of the gate conductive layer Gate may be the same as or different from those of the plurality of conductive lines 2.

In an implementation of the present disclosure, the gate conductive layer Gate and the plurality of conductive lines 2 may be disposed on the same surface, and be of the same structure and the same material. That is, the gate conductive layer Gate and the plurality of conductive lines 2 may be manufactured in a same patterning process.

For example, the gate conductive layer Gate and the plurality of conductive lines 2 may be formed by a following method.

A gate conductive material film is formed on a side of the base 1, and then the gate conductive material film is patterned to form the plurality of conductive lines 2 and the gate conductive layer Gate synchronously.

Optionally, the gate conductive material film may be patterned through a photoetching process.

In S220, as shown in FIGS. 4b and 5b, a gate insulating film GI' is formed on a side of both the plurality of conductive lines 2 and the gate conductive layer Gate away from the base 1. The gate insulating film GI' covers the gate conductive layer Gate and the plurality of conductive lines 2.

Optionally, the gate insulating film GI' may be made of silicon oxide, silicon oxynitride, silicon nitride, or other insulating materials. For example, the gate insulating film GI' may be manufactured by using a plasma enhanced chemical vapor deposition (PECVD) process.

In S230, as shown in FIGS. 4c and 5c, the gate insulating film GI' is patterned to form a gate insulating layer GI with at least one via hole K. The at least one via hole K exposes at least one portion of a surface of the at least one conductive line 2. An orthogonal projection of the at least one via hole K on the base 1 is at least partially overlapped with the orthogonal projection of the at least one conductive line 2 on the base 1. The oxide semiconductor film 3 is in direct contact with the at least one conductive line 2 through the at least one via hole K.

For example, the gate insulating film GI' may be patterned through a photoetching process to obtain the gate insulating layer GI.

Optionally, the gate insulating layer GI covers the gate conductive layer Gate. The orthogonal projection of the at least one via hole K on the base 1 is at least partially overlapped with the orthogonal projection of the at least one conductive line 2 on the base 1. That is, the at least one via hole K exposes at least one portion of the at least one conductive line 2. The via hole(s) K may be one or more.

Here, a relationship between the at least one via hole K and the at least one conductive line 2 is various, which may be selectively set according to actual needs.

For example, the at least one via hole K may be in one-to-one correspondence with the at least one conductive line 2. That is, one via hole K may expose a portion of one conductive line 2.

For example, in a case where the number of the at least one via hole K is multiple, one conductive line 2 may correspond to at least two of the multiple via holes K. That is, in the at least two via holes K, each via hole K may expose a portion of the corresponding conductive line 2.

For example, in a case where the number of the at least one conductive line 2 is multiple, one via hole K may correspond to at least two of the multiple conductive lines 2.

That is, the via hole K exposes portions of the at least two conductive lines 2 synchronously.

Accordingly, in S300 described above, the formed oxide semiconductor film 3 may be in direct contact with the at least one conductive line 2 through the at least one via hole K. In S400 described above, in the process of patterning the oxide semiconductor film 3, the static electricity generated in the oxide semiconductor film 3 may be discharged into the at least one conductive line 2 through a portion of the oxide semiconductor film 3 located in the at least one via hole K, and be discharged through the at least one conductive line 2.

In addition, in S400 described above, after the oxide semiconductor layer 3a is formed, the oxide semiconductor layer 3a may expose the at least one via hole K, and thus expose the at least one portion of the at least one conductive line 2. In other words, after the oxide semiconductor film 3 is patterned, the orthogonal projection of the formed oxide semiconductor layer 3a on the base 1 may not be overlapped with the orthogonal projection of the at least one via hole K on the base 1, so as to completely remove the oxide semiconductor material in the at least one via hole K.

In an implementation of the present disclosure, as shown in FIG. 5c, in a direction (the O-O' direction) perpendicular to a routing direction of the at least one conductive line 2, a portion of a boundary of the orthogonal projection of the at least one conductive line 2 on the base 1 coincides with a portion of a boundary of the orthogonal projection of the at least one via hole K on the base 1. That is, in the direction (the O-O' direction) perpendicular to the routing direction of the at least one conductive line 2, the at least one via hole K completely exposes the portion of the at least one conductive line 2, so that the at least one conductive line 2 and the oxide semiconductor film 3 have a large contact area therebetween, so as to improve a diffusion efficiency of electrostatic charges in the oxide semiconductor film 3.

In some embodiments, the method of manufacturing the array substrate may further include: manufacturing sources 53 and drains 54 of the oxide thin film transistors 5. For example, the method of manufacturing the array substrate may further include S500.

Figure 4F:
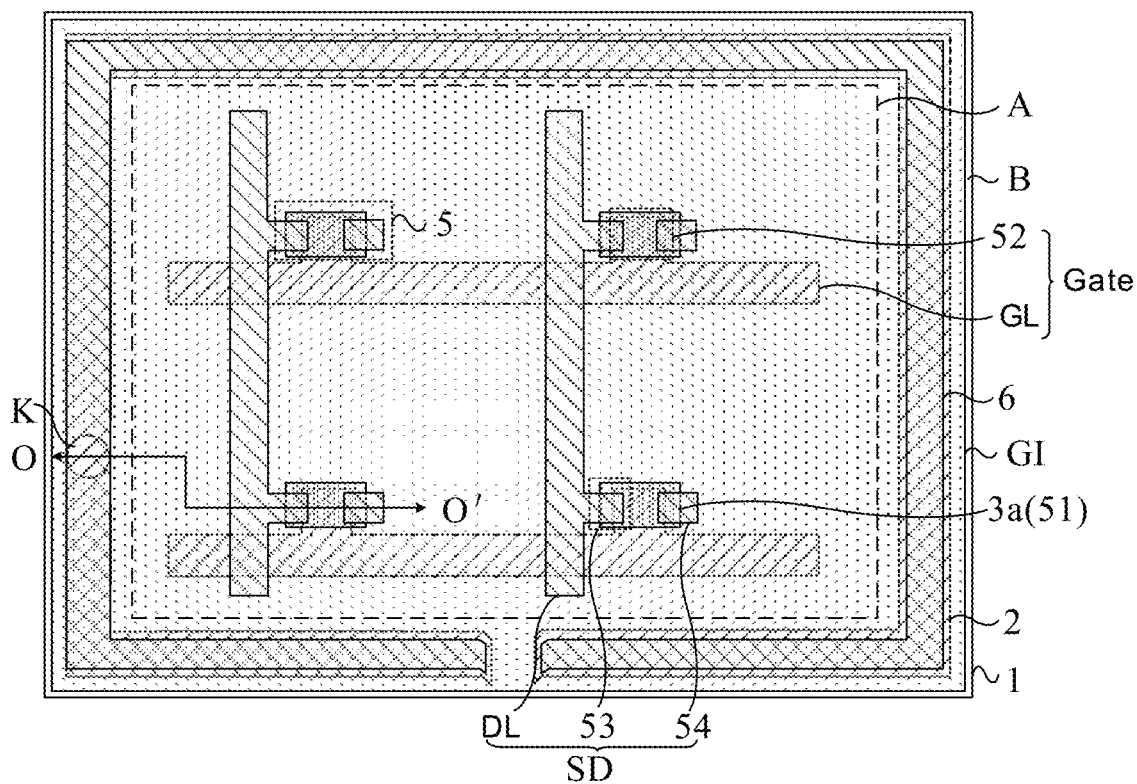
Figure 5J:
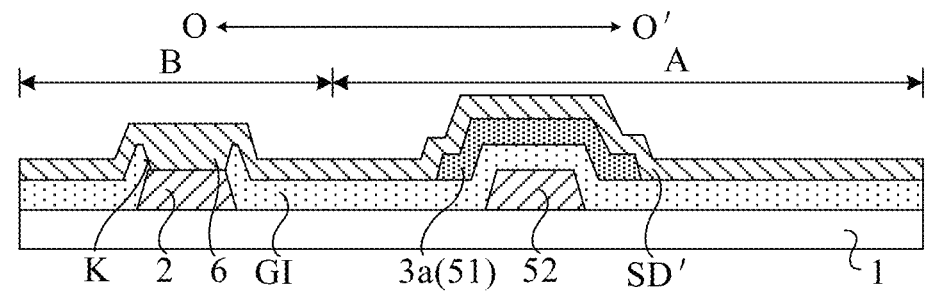
Figure 5K:
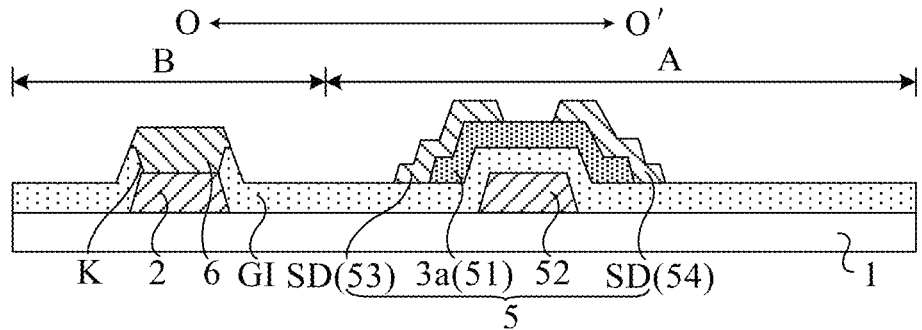
Figure 5L:
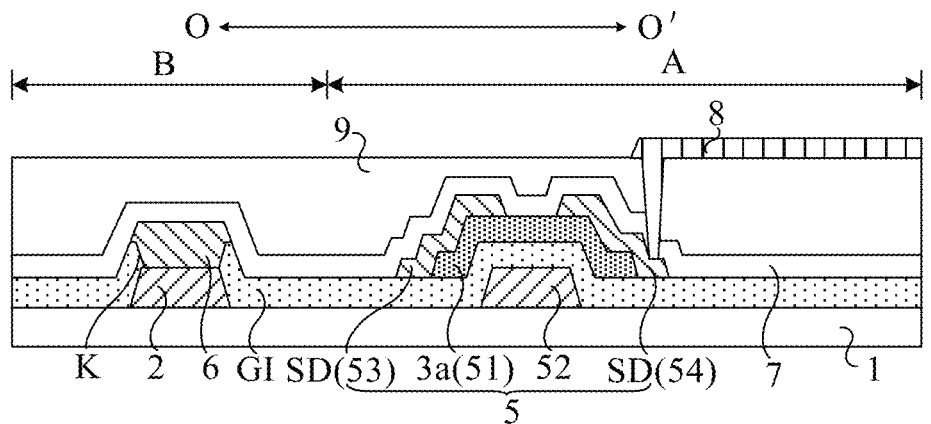

In S500, as shown in FIGS. 4f and 5k, a source-drain conductive layer SD is formed on a side of the oxide semiconductor layer 3a away from the base 1. The source-drain conductive layer SD may include a plurality of sources 53 and a plurality of drains 54. The plurality of sources 53 are electrically connected to the plurality of active layers 51 in one-to-one correspondence, and the plurality of drains 54 are electrically connected to the plurality of active layers 51 in one-to-one correspondence.

It can be understood that the oxide thin film transistor 5 may include the active layer 51, the source 53 and the drain 54.

Optionally, as shown in FIGS. 4f and 5k, the source-drain conductive layer SD may further include auxiliary lead(s) 6, and the auxiliary lead(s) 6 are electrically connected to the at least one conductive line 2. For example, the auxiliary lead(s) 6 may be in direct contact with the at least one conductive line 2 in one-to-one correspondence, so as to form electrical connection(s).

By electrically connecting the auxiliary lead(s) 6 and the at least one conductive line 2, the auxiliary lead 6 may be used to reduce a resistance of the conductive line 2 electrically connected to the auxiliary lead 6, which improves stability of an electrical signal transmitted in the conductive line 2. In addition, since the auxiliary lead 6 may be used to reduce the resistance of the conductive line 2 electrically connected to the auxiliary lead 6, a line width (i.e., a dimension of the conductive line 2 in the direction perpendicular to the routing direction of the conductive line 2) of the conductive line 2 may be reduced, thereby reducing a space ratio of the conductive line 2 in the array substrate.

In an implementation of the present disclosure, the source-drain conductive layer SD may be formed by a following method.

For example, as shown in FIG. 5*j*, a source-drain conductive material film SD' may be formed on the side of the oxide semiconductor layer 3*a* away from the base 1, and the source-drain conductive material film SD' covers the portion of the at least one conductive line 2 that is exposed through the at least one via hole K, a portion of the gate insulating layer GI that is not covered by the active layers 51, and the active layers 51.

Optionally, the source-drain conductive material film SD' may be made of titanium (Ti), platinum (Pt), ruthenium (Ru), gold (Au), silver (Ag), molybdenum (Mo), aluminum (Al), tungsten (W), copper (Cu), neodymium (Nd), chromium (Cr), tantalum (Ta), or an alloy thereof, or a combination of at least two of the foregoing materials. The source-drain conductive material film SD' may be of a single-layer structure formed by a layer of conductive material, or may be of a multi-layer structure formed by a plurality of layers of conductive materials that are sequentially stacked.

Optionally, a sputtering process may be used to form the source-drain conductive material film SD'.

For example, as shown in FIG. 5*k*, the source-drain conductive material film SD' may be patterned to form the source-drain conductive layer SD including the auxiliary lead(s) 6, the sources 53 and the drains 54.

Optionally, the source-drain conductive material film SD' may be patterned through a photoetching process.

Optionally, the source-drain conductive layer SD may further include source-drain layer leads, for example, include voltage lead(s) and data lines DL.

Optionally, orthogonal projections of the auxiliary lead 6 and the conductive line 2 electrically connected to the auxiliary lead 6 on the base 1 may coincide with each other or may partially overlap.

Figure 4G:
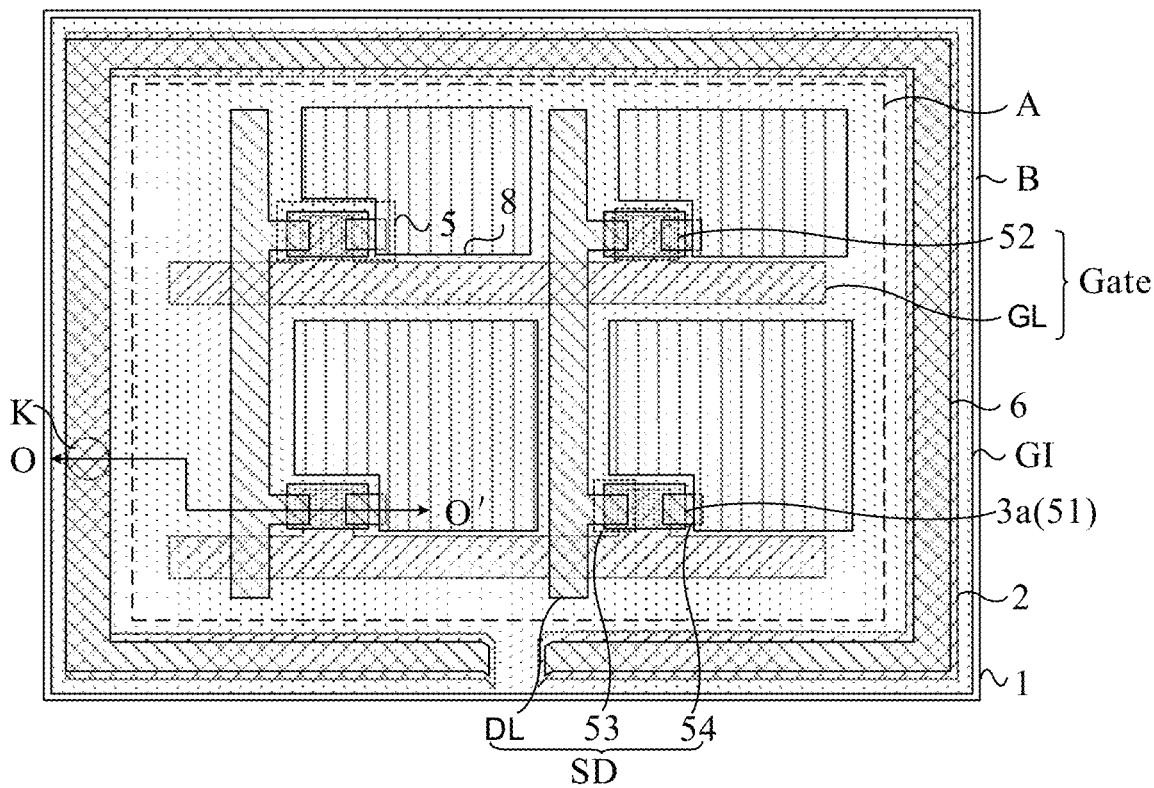

In some embodiments, as shown in FIGS. 4*g* and 5I, the formed array substrate 100 may have a display area A and a bezel area B located beside the display area A. Accordingly, the base 1 also has a bezel area and a display area. An orthogonal projection of the bezel area B of the array substrate 100 on a plane parallel to the base 1 coincides with an orthogonal projection of the bezel area of the base 1 on the plane parallel to the base 1, and an orthogonal projection of the display area A of the array substrate 100 on the plane parallel to the base 1 coincides with an orthogonal projection of the display area of the base 1 on the plane parallel to the base 1.

For example, beside the display area A refer to a side, two sides, three sides, or peripheral sides of the display area A (as shown in FIG. 4*g*), which means that the bezel area B may be located at one, two or three sides of the display area A, or the bezel area B may be arranged around the display area A.

In some examples, as shown in FIGS. 4*g* and 5I, the at least one conductive line 2 that is in direct contact with the oxide semiconductor film 3 may be formed in the bezel area B of the array substrate 100. In this case, the at least one conductive line 2 may be first common electrode line(s) used to provide a common voltage signal to the display area A, or may be electrostatic protection line(s) used to perform an electrostatic protection on the array substrate 100.

The at least one conductive line 2 may have a large dimension in the direction perpendicular to the routing direction of the at least one conductive line 2, so as to ensure that the at least one conductive line 2 has a small impedance, thereby ensuring the stability of the electrical signal transmitted by the at least one conductive line 2. By electrically connecting the at least one conductive line 2 and the auxiliary lead(s) 6, the resistance of the at least one conductive line 2 may be reduced, thereby reducing the line width of the at least one conductive line 2, which is beneficial to reducing a size of the bezel area B, so as to realize a narrow bezel design for the array substrate 100.

In some other examples, the at least one conductive line 2 that is in direct contact with the oxide semiconductor film 3 may be formed in the display area A of the array substrate 100. In this case, the at least one conductive line 2 may be second common electrode line(s) that transmit a common voltage signal to an electrode layer (e.g., a common electrode layer or a cathode layer) in the array substrate.

In some embodiments, as shown in FIG. 5I, the method of manufacturing the array substrate may further include: forming a passivation layer (PVX) 7 on a side of the oxide thin film transistors 5 away from the base 1. As shown in FIGS. 4*g* and 5I, a plurality of pixel electrodes 8 are formed on a side of the passivation layer 7 away from the base 1, and the plurality of pixel electrodes 8 are electrically connected to the sources 53 or the drains 54 of the plurality of oxide thin film transistors 5 in one-to-one correspondence.

Further, as shown in FIG. 5I, the method of manufacturing the array substrate may further include: before forming the pixel electrodes 8, forming a planarization layer covering the passivation layer 7, so as to provide a planar surface for the pixel electrodes 8. Here, the pixel electrodes 8 may be formed on a surface of the planarization layer away from the base 1.

Based on this, the manufactured array substrate 100 may be applied to a liquid crystal display (LCD) apparatus. In this case, the method of manufacturing the array substrate 100 may further include: forming a common electrode at a side of the pixel electrodes 8 away from the base 1.

In an implementation of the present disclosure, the method of manufacturing the array substrate may further include: sequentially forming a light-emitting layer and the cathode layer on the side of the pixel electrode 8 away from the base 1. In a case where the at least one conductive line 2 is the first common electrode line(s) or the second common electrode line(s), the cathode layer may be electrically connected to the at least one conductive line 2, or electrically connected to the auxiliary lead(s) 6, or electrically connected to both the at least one conductive line 2 and the auxiliary lead(s) 6.

Based on this, the manufactured array substrate may be applied to an organic light-emitting diode (OLED) display apparatus.

An implementation manner of the method of manufacturing the array substrate will be exemplarily introduced below, so as to further explain and describe the principle and the effects of the method of manufacturing the array substrate. The method of manufacturing the array substrate is exemplarily as follows.

For example, the base 1 is provided. The base 1 is a glass base. The base 1 has the display area and the bezel area around the display area.

The gate conductive material film is formed on the side of the base 1, and the gate conductive material film covers the display area and the bezel area of the base 1. The gate conductive material film may be formed through a deposition process. For example, the gate conductive material film may be formed through a magnetron sputtering deposition process.

For example, as shown in FIGS. 4*a* and 5*a*, the gate conductive material film is patterned to form the gate conductive layer Gate located in the display area A and the plurality of conductive lines 2 located in the bezel area B. The gate conductive layer Gate includes the plurality of gate lines GL and the plurality of gates 52 used to form the oxide thin film transistors 5. The plurality of conductive lines 2 include at least one common electrode line used to provide the common voltage signal to the display area and/or at least one electrostatic protection line used to perform the electrostatic protection on the array substrate 100.

For example, as shown in FIGS. 4*b* and 5*b*, the gate insulating film GI' covering the gate conductive layer Gate and the plurality of conductive lines 2 is formed on the side of both the gate conductive layer Gate and the plurality of conductive lines 2 away from the base 1. The gate insulating film GI' may be formed through a deposition process. For example, the gate insulating film GI' may be formed through a chemical vapor deposition (CVD) process.

For example, as shown in FIGS. 4*c* and 5*c*, the gate insulating film GI' is patterned with a mask to form the gate insulating layer GI with the at least one via hole K. The at least one via hole K exposes the portion of the at least one conductive line 2. Optionally, in the direction (the O-O' direction) perpendicular to the routing direction of the at least one conductive line 2, the portion of the boundary of the orthogonal projection of the at least one conductive line 2 on the base 1 coincides with the portion of the boundary of the orthogonal projection of the at least one via hole K on the base 1. It can be understood that the mask may have a pattern used to form the at least one via hole K in the bezel area B.

For example, as shown in FIGS. 4*d* and 5*d*, the oxide semiconductor film 3 is formed on a side of the gate insulating layer GI away from the base 1. The oxide semiconductor film 3 is located both in the display area A and the bezel area B. The oxide semiconductor film 3 is in direct contact with the at least one conductive line 2 through the at least one via hole K in the gate insulating layer GI. Here, the oxide semiconductor film 3 may be formed through a deposition process. For example, the oxide semiconductor film 3 may be formed through a magnetron sputtering process.

For example, as shown in FIGS. 4*e* and 5*e* to 5*i*, the oxide semiconductor film 3 is patterned to form the oxide semiconductor layer 3*a*. The oxide semiconductor layer 3*a* includes the plurality of active layers 51 used to form the oxide thin film transistors 5, and the oxide semiconductor layer 3*a* does not cover the at least one conductive line 2. In other words, the orthogonal projection of the oxide semiconductor layer 3*a* on the base 1 is completely non-overlapped with the orthogonal projection of the at least one conductive line 2 on the base 1.

Here, in the process of patterning the oxide semiconductor film 3, a substrate including the oxide semiconductor film 3 may be transported into the exposure machine for exposure. Since the oxide semiconductor material is usually the substance with the amorphous structure, and is poor in conductivity, the static electricity is easily generated in the oxide semiconductor film 3 in the exposure machine. Since the oxide semiconductor film 3 is in direct contact with the at least one conductive line 2, the static electricity generated in the oxide semiconductor film 3 may be discharged into the at least one conductive line 2, and be discharged through the at least one conductive line 2, which reduces or even avoids the electrostatic accumulation, and effectively avoids the electrostatic breakdown.

After the oxide semiconductor film 3 is patterned, the portion of the oxide semiconductor film 3 located above and inside the at least one via hole K is removed to expose the portion of the surface of the at least one conductive line 2.

For example, as shown in FIG. 5*j*, the source-drain conductive material film SD' is formed on the side of the oxide semiconductor layer 3*a* away from the base 1, and the source-drain conductive material film SD' is located both in the display area A and the bezel area B. That is, the source-drain conductive material film SD' covers the exposed at least one conductive line 2, the portion of the gate insulating layer GI that is not covered by the active layers 51, and the active layers 51. The source-drain conductive material film SD' may be formed through a deposition process. For example, the source-drain conductive material film SD' may be formed through a magnetron sputtering process.

For example, as shown in FIGS. 4*f* and 5*k*, the source-drain conductive material film SD' is patterned to form the source-drain conductive layer SD. The source-drain conductive layer SD includes the auxiliary lead(s) 6 located in the bezel area B and in direct contact with the at least one conductive line 2 through the via hole(s) K, and both a plurality of data lines DL and the sources 53 and the drains 54 of the oxide thin film transistors 5 located in the display area A.

The auxiliary lead 6 may be connected in parallel with the conductive line 2 to reduce the resistance of the conductive line 2, which not only improves the stability of the electrical signal transmitted in the at least one conductive line 2, but also reduces the dimension of the at least one conductive line 2 in the direction perpendicular to the routing direction of the at least one conductive line 2, thereby facilitating reduction in the size of the bezel area B, and facilitating realization of the narrow frame design for the array substrate 100.

For example, as shown in FIG. 5I, the passivation layer (PVX) 7 and the planarization layer 9 are sequentially formed on a side of the source-drain conductive layer SD away from the base 1.

For example, as shown in FIGS. 4*g* and 5I, the plurality of pixel electrodes 8 are formed on a side of the planarization layer away from the base 1. The plurality of pixel electrodes 8 are electrically connected to the drains 54 of the plurality of oxide thin film transistors 5, respectively. A material of the pixel electrodes 8 may be, for example, ITO.

Furthermore, the method of manufacturing the array substrate may exemplarily further include: sequentially forming the light-emitting layer and the cathode layer on the side of the pixel electrodes 8 away from the base 1, the cathode layer extending to the bezel area B and being in direct contact with the auxiliary lead(s) 6 to form electrical connections; forming a protective layer on a side of the cathode layer away from the base 1. Here, the conductive line 2 electrically connected to the auxiliary lead may be the common electrode line.

It will be noted that although the various steps of the method are described in a specific order in the drawings, this does not require or imply that these steps must be performed in the specific order, or that all the steps shown must be performed to achieve to a desired result. Additionally or alternatively, certain steps may be omitted, a plurality of steps may be combined into one step for execution, and/or one step may be broken down into a plurality of steps for execution, which all should be regarded as parts of the present disclosure.

Figure 6:
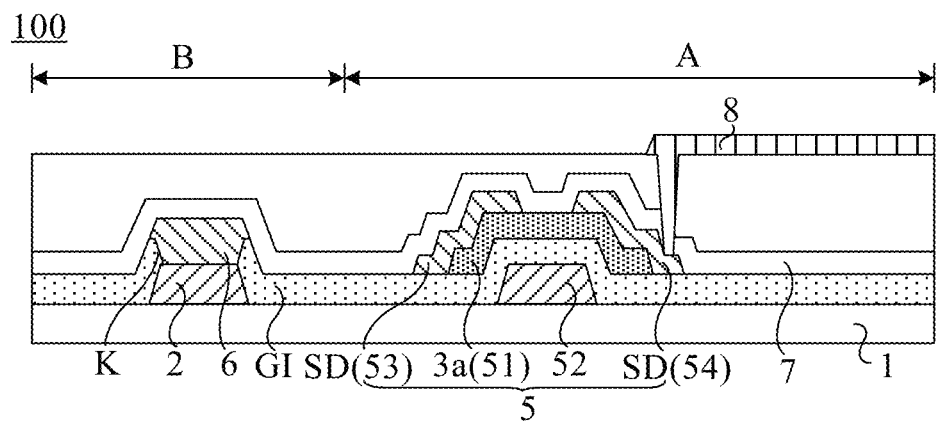
FIG. 6 is a structural diagram of an array substrate, in accordance with some embodiments of the present disclosure.

Some embodiments of the present disclosure further provide an array substrate 100. As shown in FIG. 6, the array substrate 100 may include a base 1, a plurality of conductive lines 2 and a plurality of oxide thin film transistors 5.

In some examples, a material of the base 1 may refer to the schematic descriptions in some of the above embodiments, which will not be repeated here.

In some examples, as shown in FIG. 6, the plurality of oxide thin film transistors 5 and the plurality of conductive lines 2 are disposed on the same side of the base 1.

For example, each oxide thin film transistor 5 includes an active layer 51, a gate 52, a source 53 and a drain 54. The active layer 51 of any oxide thin film transistor 5 is obtained by patterning an oxide semiconductor film 3 that is in direct contact with at least one conductive line 2 (e.g., reference may be made to the method of manufacturing the array substrate provided in some of the above embodiments). The active layer 51 of any oxide thin film transistor 5 and the at least one conductive line 2 are insulated from each other.

A category of the active layers 51 is various. For example, the material of the active layers 51 may be an oxide semiconductor material. Optionally, the oxide semiconductor material may be an amorphous oxide semiconductor material. For example, the amorphous oxide semiconductor material may be one of zinc oxide, indium oxide, stannic oxide, indium zinc oxide, zinc tin oxide, aluminum zinc oxide, yttrium zinc oxide, indium tin zinc oxide, indium gallium zinc oxide or indium aluminum zinc oxide.

The array substrate 100 provided by some embodiments of the present disclosure may be manufactured through the method of manufacturing the array substrate in some of the above embodiments. Since the active layers 51 of the plurality of oxide thin film transistors 5 are obtained by patterning the oxide semiconductor film 3 that is in direct contact with the at least one conductive line 2, and the at least one conductive line 2 has a good conductivity, static electricity generated in the oxide semiconductor film 3 may be discharged into the at least one conductive line 2, and be discharged through the at least one conductive line 2, which avoids an electrostatic accumulation in an oxide semiconductor layer 3a including a plurality of active layers 51, thereby avoiding an electrostatic breakdown, and effectively improving a yield of the array substrate 100.

A structure of the array substrate 100 in some embodiments of the present disclosure will be schematically described below with reference to the accompanying drawings.

Here, as shown in FIG. 6, the oxide thin film transistor 5 is a bottom-gate oxide thin film transistor, which is taken as an example.

Based on this, the plurality of conductive lines 2 and the gates 52 of respective oxide thin film transistors 5 are located at a side of the active layers 51 proximate to the base 1.

In some examples, the plurality of conductive lines 2 and the gates 52 are made of the same material and arranged in the same layer.

It will be noted that the "same layer" mentioned herein means that a film for forming a specific pattern is formed by using the same film-forming process, and then is patterned by a same patterning process by using the same mask to form a layer to structure. Depending on different specific patterns, the same patterning process may include several exposure, development or etching processes, the specific patterns formed in the layer structure may be continuous or discontinuous, and these specific patterns may also be at different heights or have different thicknesses. In this way, the plurality of conductive lines 2 and the gates 52 may be manufactured in a same patterning process, which is beneficial to simplify a manufacturing process of the array substrate 100.

In some embodiments, the array substrate 100 further includes a gate insulating layer GI disposed between the gates 52 and the active layers 51. Here, the gates 52 belong to a gate conductive layer Gate, and the active layers 51 belong to the oxide semiconductor layer 3a. That is, the gate insulating layer GI is located between the gate conductive layer Gate and the oxide semiconductor layer 3a. For example, the gate conductive layer Gate may further include gate lines GL.

In some examples, as shown in FIG. 6, the gate insulating layer GI has at least one via hole K that exposes at least one portion of the at least one conductive line 2. That is, an orthogonal projection of the at least one via hole K on the base 1 is at least partially overlapped with an orthogonal projection of the at least one conductive line 2 on the base 1.

For example, in a direction (the O-O' direction) perpendicular to a routing direction of the at least one conductive line 2, a portion of a boundary of the orthogonal projection of the at least one conductive line 2 on the base 1 coincides with a portion of a boundary of the orthogonal projection of the at least one via hole K on the base 1.

The oxide semiconductor film 3 may be electrically connected to the at least one conductive line 2 through the at least one via hole K. In this way, in a case where the static electricity is generated in the oxide semiconductor film 3, the static electricity may be discharged into the at least one conductive line 2 through a portion of the oxide semiconductor film 3 located in the at least one via hole K, and then the static electricity is discharged through the at least one conductive line 2.

In some examples, as shown in FIG. 6, the array substrate further includes auxiliary lead(s) 6 that are in direct contact with the at least one conductive line 2.

The auxiliary lead(s) 6 can be set in various ways, which may be selectively set according to actual needs.

For example, as shown in FIG. 6, the auxiliary lead(s) 6 may be disposed on a side of the gate insulating layer GI away from the base 1, and the auxiliary lead(s) 6 are in direct contact with the at least one conductive line 2 through the at least one via hole K. In this way, the auxiliary lead(s) 6 may be used to reduce a resistance of the at least one conductive line 2, thereby reducing a dimension of the at least one conductive line 2 in the direction perpendicular to the routing direction of the at least one conductive line 2, and reducing a space ratio of the at least one conductive line 2 in the array substrate 100.

For example, as shown in FIG. 6, the auxiliary lead(s) 6 and the sources 53 and the drains 54 of the oxide thin film transistors 5 may be made of the same material and arranged in the same layer. In this way, the auxiliary lead(s) 6, the sources 53, and the drains 54 may be manufactured in a same patterning process, which is beneficial to simplify the manufacturing process of the array substrate 100.

Here, for example, a film including the auxiliary lead(s) 6, the sources 53 and the drains 54 may be referred to as a source-drain conductive layer SD. Optionally, the source-drain conductive layer SD may further include data lines DL and power lines.

In some examples, as shown in FIG. 6, orthogonal projection(s) of the auxiliary lead(s) 6 on the base 1 are at least partially overlapped with the orthogonal projection of the at least one conductive line 2 on the base 1.

For example, the auxiliary lead(s) 6 are in one-to-one correspondence with the at least one conductive line 2. The orthogonal projection of the auxiliary lead 6 on the base 1 is at least partially overlapped with the orthogonal projection of a corresponding conductive line 2 on the base 1, which may include: a partial misalignment being present between the auxiliary lead 6 and the conductive line 2, so that a portion of the orthogonal projection of the auxiliary lead 6 on the base 1 is overlapped with a portion of the orthogonal projection of the corresponding conductive line 2 on the base 1; or, the orthogonal projection of the auxiliary lead 6 on the base 1 being located within the orthogonal projection of the corresponding conductive line 2 on the base 1.

In some examples, as shown in FIG. 4g, a routing direction of the auxiliary lead 6 is the same or substantially the same as the routing direction of the at least one conductive line 2. That is, an angle between a routing direction of a portion of the auxiliary lead 6 and a routing direction of a portion of the conductive line 2 that is overlapped with the portion of the auxiliary lead 6 is 0° or approximately 0°. This is beneficial to ensure the reduction in the resistance of the at least one conductive line 2.

In some embodiments, as shown in FIG. 6, the array substrate 100 may further include a passivation layer 7 disposed on a side of both the sources 53 and the drains 54 away from the base 1 (i.e., covering the oxide thin film transistors 5).

Figure 7:
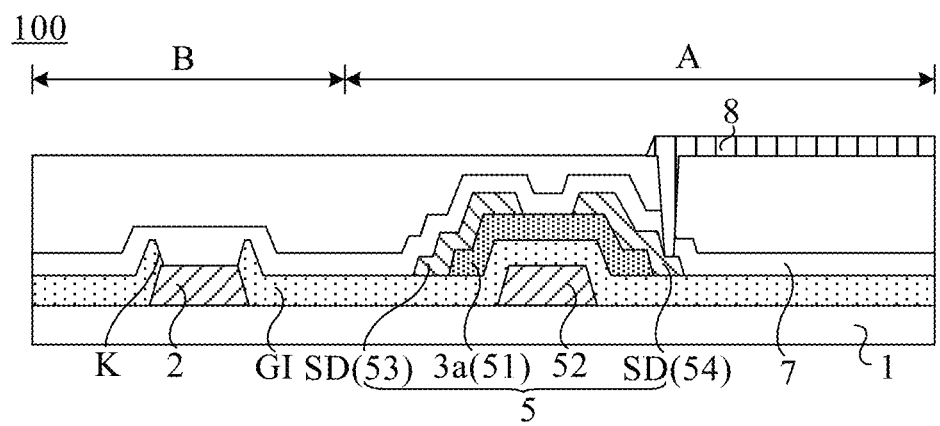
FIG. 7 is a structural diagram of another array substrate, in accordance with some embodiments of the present disclosure.

In some examples, as shown in FIG. 7, in a case where the array substrate 100 does not include the auxiliary lead 6, a portion of the passivation layer 7 may be located in the at least one via hole K in the gate insulating layer GI. In this way, it is possible to prevent a conductive layer (e.g., pixel electrodes 8) subsequently formed from forming electrical connection(s) with the at least one conductive line 2, so as to avoid signal crosstalk.

In some embodiments, as shown in FIG. 6, the array substrate 100 may further include the pixel electrodes 8 disposed at a side of the passivation layer 7 away from the base 1. The pixel electrodes 8 may be, for example, electrically connected to the drains 54 of the oxide thin film transistors 5.

Optionally, the array substrate 100 may further include a planarization layer disposed between the passivation layer 7 and the pixel electrodes 8.

In some embodiments, as shown in FIG. 6, the array substrate 100 has a display area A and a bezel area B located beside the display area A. For "beside the display area A", reference may be made to the schematic descriptions in some of the above examples.

In some examples, the oxide thin film transistors 5 in the array substrate 100 may be located in the display area A. Among the plurality of conductive lines 2, the at least one conductive line 2 electrically connected to the oxide semiconductor film 3 may be located in the display area A, or may be located in the bezel area B.

Here, in a case where the at least one conductive line 2 is located in the display area A, the at least one conductive line 2 may be second common electrode line(s) that transmit a common voltage signal to an electrode layer (e.g., a common electrode layer or a cathode layer) in the array substrate. In a case where the at least one conductive line 2 is located in the bezel area B, the at least one conductive line 2 may be first common electrode line(s) used to provide a common voltage signal to the display area A, or may be electrostatic protection line(s) used to perform an electrostatic protection on the array substrate 100.

An implementation manner of the array substrate in the present disclosure will be exemplarily introduced below to further explain and describe the structure and principle of the array substrate in the present disclosure.

In an exemplary array substrate 100, as shown in FIG. 6, the array substrate 100 may include the base 1, the plurality of conductive lines 2, the gate conductive layer Gate, the gate insulating layer GI, the oxide semiconductor layer 3a, the source-drain conductive layer SD, the passivation layer 7 and the plurality of pixel electrodes 8.

For example, the base 1 may be a glass base. The base 1 may have a display area and a bezel area around the display area.

For example, the plurality of conductive lines 2 may be located in the bezel area of the base 1. The gate conductive layer Gate may be located in the display area of the base 1. The gate conductive layer Gate and the plurality of conductive lines 2 may be disposed on the same side and located on the same surface of the base 1. For example, the gate conductive layer Gate and the plurality of conductive lines 2 are made of the same material and arranged in the same layer. The gate conductive layer Gate may include the plurality of gate lines GL and the plurality of gates 52 used to form the oxide thin film transistors 5.

For example, the gate insulating layer GI may be disposed on a side of both the plurality of conductive lines 2 and the gate conductive layer Gate away from the base 1. The gate insulating layer GI has the at least one via hole K, and the at least one via hole K exposes a portion of the at least one of the plurality of conductive lines 2. That is, the orthogonal projection of the at least one via hole K on the base 1 is partially overlapped with the orthogonal projection of the at least one conductive line 2 on the base 1.

For example, the oxide semiconductor layer 3a may be disposed at the side of the gate conductive layer Gate away from the base 1. The oxide semiconductor layer 3a includes the plurality of active layers 51 used to form the oxide thin film transistors 5, and an orthogonal projection of the oxide semiconductor layer 3a on the base 1 is completely non-overlapped with the orthogonal projection of the at least one conductive line 2 on the base 1. The oxide semiconductor layer 3a is obtained by patterning the oxide semiconductor film 3 that is in direct contact with the at least one conductive line 2.

For example, the source-drain conductive layer SD may be disposed on a side of the oxide semiconductor layer 3a away from the base 1. The source-drain conductive layer SD may include the auxiliary lead(s) 6 electrically connected to the at least one conductive line 2 through the at least one via hole K in the gate insulating layer GI, a plurality of source-drain layer leads (e.g., data lines DL), and the sources 53 and the drains 54 of the oxide thin film transistors 5. The auxiliary lead(s) 6 may be disposed in the bezel area B, and the source-drain layer leads, the sources 53, and the drains 54 are disposed in the display area A.

For example, the passivation layer 7 may be formed on a side of the source-drain conductive layer SD away from the base 1. The passivation layer 7 may expose portions of the drains 54 in the source-drain conductive layer SD.

For example, the plurality of pixel electrodes 8 may be disposed at the side of the passivation layer 7 away from the base 1. The plurality of pixel electrodes 8 may be electrically connected to the plurality of drains 54 in one-to-one correspondence.

The array substrate 100 may be manufactured through the method of manufacturing the array substrate in some of the above embodiments, and the structure, principle and effects of the array substrate 100 have been described in detail in the method of manufacturing the array substrate in some of the above embodiments, which will not be repeated here.

Figure 8:
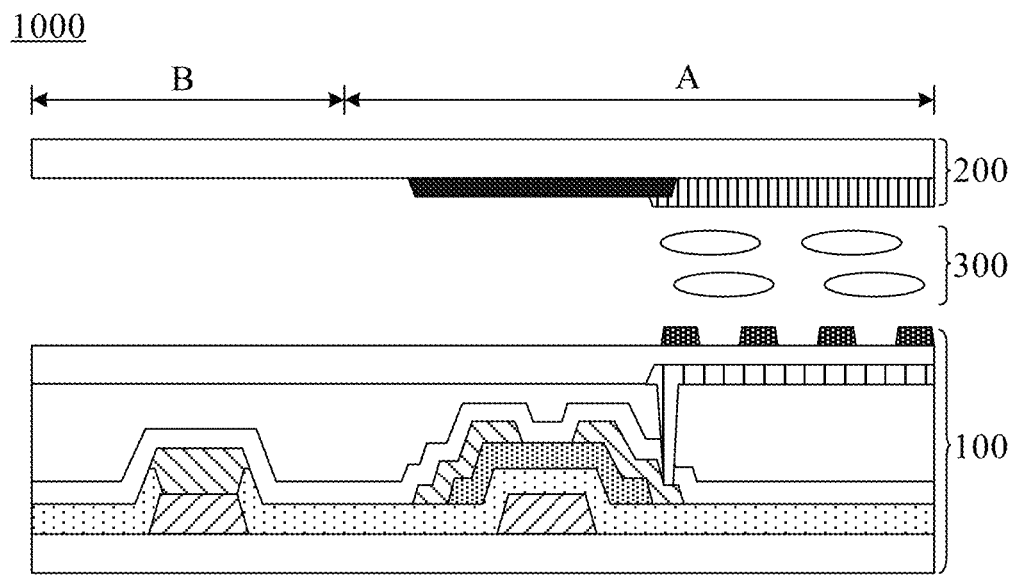
FIG. 8 is a structural diagram of a display apparatus, in accordance with some embodiments of the present disclosure.
Figure 9:
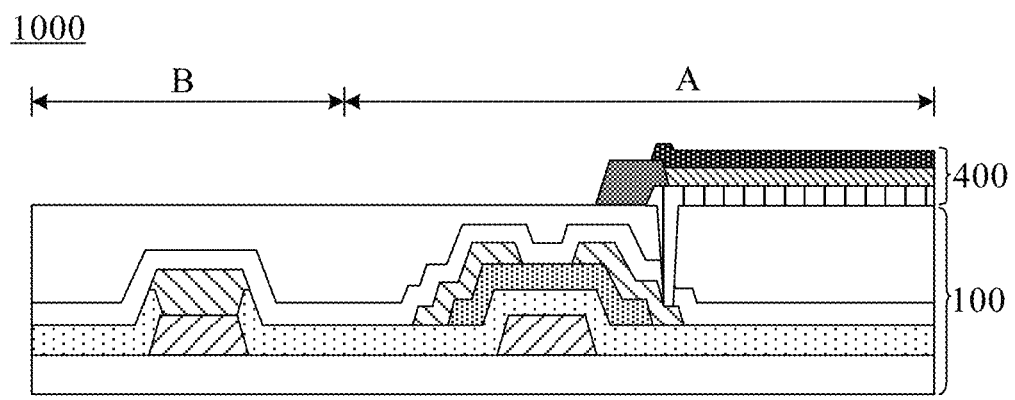
FIG. 9 is a structural diagram of another display apparatus, in accordance with some embodiments of the present disclosure.

Some embodiments of the present disclosure further provide a display apparatus 1000. As shown in FIGS. 8 and 9, the display apparatus 1000 includes the array substrate 100 as described in some of the above embodiments.

Beneficial effects that may be achieved by the display apparatus 1000 in some embodiments of the present disclosure are the same as the beneficial effects that may be achieved by the array substrate 100 in some of the above embodiments, which will not be repeated here.

A category of the display apparatus 1000 is various, which may be selectively set according to actual needs.

In some examples, as shown in FIG. 8, the display apparatus 1000 may be a liquid crystal display (LCD) apparatus. In this case, the display apparatus 1000 may further include an opposite substrate 200 arranged opposite to the array substrate 100, and a liquid crystal layer 300 disposed between the array substrate 100 and the opposite substrate 200.

For example, the opposite substrate 200 may be a transparent substrate, or may be a color film substrate (as shown in FIG. 8). In a case where the opposite substrate 200 is the transparent substrate, the array substrate 100 may further include a color film layer and/or black matrixes disposed on a side of the pixel electrodes 8 proximate to the opposite substrate 200.

In some other examples, as shown in FIG. 9, the display apparatus 1000 may be an organic light-emitting diode (OLED) display apparatus. In this case, the display apparatus 1000 may further include a plurality of light-emitting devices 400 disposed on a side of the plurality of oxide thin film transistors 5 in the array substrate 100 away from the base 1.

For example, the pixel electrode 8 in the array substrate 100 may be referred to as an anode layer of the light-emitting device 400. On this basis, the light-emitting device 400 may further include a light-emitting layer and a cathode layer that are sequentially stacked on a side of the anode layer away from the base 1.

In some embodiments, the display apparatus 100 may be any apparatus that displays images whether in motion (e.g., a video) or stationary (e.g., a static image), and whether literal or graphical. It is anticipated that the described embodiments may be implemented in or associated with a variety of electronic devices, such as (but not limited to) mobile phones, wireless devices, personal digital assistants (PDA), handheld or portable computers, global positioning system (GPS) receivers/navigators, cameras, moving picture experts group 4 (MP4) video players, video cameras, game consoles, watches, clocks, calculators, television monitors, computer monitors, car displays (e.g., odometer displays), navigators, cockpit controllers and/or displays, camera view displays (e.g., rear-view camera displays in vehicles), electronic photographs, electronic billboards or direction boards, projectors, building structures, packaging and aesthetic structures (e.g., a display for an image of a piece of jewelry).

It can be understood that the present disclosure does not limit the application thereof to the detailed structures and arrangements of the components proposed in the description. The present disclosure may have other implementation manners, and may be implemented and executed in various ways. The above deformation and modification forms fall within the scope of the present disclosure. It can be understood that the present disclosure disclosed and defined in the description extends to all alternative combinations of two or more individual features mentioned or obvious in the context and/or the accompanying drawings. All these different combinations constitute various alternative aspects of the present disclosure.

The forgoing descriptions are merely specific implementation manners of the present disclosure, but the protection scope of the present disclosure is not limited thereto. Changes or replacements that any person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A method of manufacturing an array substrate, comprising:
   providing a base;
   forming a plurality of conductive lines on the base;
   forming an oxide semiconductor film on a side of the plurality of conductive lines away from the base, the oxide semiconductor film covering the plurality of conductive lines and being in direct contact with at least one conductive line, and the at least one conductive line being configured to discharge static electricity generated in the oxide semiconductor film; and
   patterning the oxide semiconductor film by using a photoetching process to remove a portion of the oxide semiconductor film that is in direct contact with the at least one conductive line, and form an oxide semiconductor layer including active layers of a plurality of oxide thin film transistors, the oxide semiconductor layer and the at least one conductive line being insulated from each other.

2. The method of manufacturing the array substrate according to claim 1, further comprising:
   before forming the oxide semiconductor film, forming a gate conductive layer including gates of the plurality of oxide thin film transistors, the gate conductive layer and the plurality of conductive lines being located on the same side of the base;
   forming a gate insulating film on a side of both the plurality of conductive lines and the gate conductive layer away from the base, the gate insulating film covering the plurality of conductive lines and the gate conductive layer; and
   patterning the gate insulating film to form a gate insulating layer with at least one via hole, an orthogonal projection of the at least one via hole on the base being at least partially overlapped with an orthogonal projection of the at least one conductive line on the base;
   wherein the oxide semiconductor film is in direct contact with the at least one conductive line through the at least one via hole.

3. The method of manufacturing the array substrate according to claim 2, wherein a portion of a boundary of the orthogonal projection of the at least one conductive line on the base coincides with a portion of a boundary of the orthogonal projection of the at least one via hole on the base.

4. The method of manufacturing the array substrate according to claim 2, wherein a material of the plurality of conductive lines includes a metal material; and the plurality of conductive lines and the gate conductive layer are formed in a same patterning process.

5. The method of manufacturing the array substrate according to claim 1, further comprising:

forming a source-drain conductive layer on a side of the oxide semiconductor layer away from the base, the source-drain conductive layer including sources and drains of the plurality of oxide thin film transistors that are in direct contact with respective active layers.

6. The method of manufacturing the array substrate according to claim 5, wherein the array substrate has a display area and a bezel area located beside the display area; the source-drain conductive layer further includes at least one auxiliary lead that is in direct contact with the at least one conductive line;

the at least one conductive line and the at least one auxiliary lead are located in the bezel area;

the at least one conductive line is configured to transmit a common voltage signal to the display area, or to perform an electrostatic protection on the array substrate; and the at least one auxiliary lead is configured to be connected in parallel with the at least one conductive line, so as to reduce a resistance of the at least one conductive line.

7. The method of manufacturing the array substrate according to claim 1, wherein a material of the oxide semiconductor film includes one of zinc oxide, indium oxide, stannic oxide, indium zinc oxide, zinc tin oxide, aluminum zinc oxide, yttrium zinc oxide, indium tin zinc oxide, indium gallium zinc oxide, and indium aluminum zinc oxide.

8. The method of manufacturing the array substrate according to claim 1, wherein an orthogonal projection of the oxide semiconductor layer on the base is at most partially overlapped with an orthogonal projection of the at least one conductive line on the base.

\* \* \* \* \*